United States Patent
Clevenger et al.

(10) Patent No.: US 6,624,526 B2
(45) Date of Patent: Sep. 23, 2003

(54) COMPACT SRAM CELL INCORPORATING REFRACTORY METAL-SILICON-NITROGEN RESISTIVE ELEMENTS AND METHOD FOR FABRICATING

(75) Inventors: Lawrence Clevenger, LaGrangeville, NY (US); Louis Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/872,325

(22) Filed: Jun. 1, 2001

(65) Prior Publication Data

US 2002/0180068 A1 Dec. 5, 2002

(51) Int. Cl.[7] .......................... H01L 27/11; H01L 29/00
(52) U.S. Cl. ...................... 257/904; 257/903; 257/536; 257/537
(58) Field of Search ................................ 257/904, 903, 257/536, 537

(56) References Cited

U.S. PATENT DOCUMENTS

| | | | | |
|---|---|---|---|---|
| 5,422,296 A | * | 6/1995 | Lage | 438/212 |
| 5,578,854 A | * | 11/1996 | Chen et al. | 257/347 |
| 6,297,129 B2 | * | 10/2001 | Tran et al. | 257/305 |
| 6,359,319 B1 | * | 3/2002 | Noda | 257/380 |

* cited by examiner

*Primary Examiner*—Steven Loke
*Assistant Examiner*—Samuel A Gebremariam
(74) *Attorney, Agent, or Firm*—Robert M. Trepp

(57) ABSTRACT

A compact SRAM cell that incorporates refractory metal-silicon-nitrogen resistive elements as its pull-up transistors is described which includes a semi-conducting substrate, a pair of NMOS transfer devices formed vertically on the sidewalls of an etched substrate by a metal conductor providing electrical communication between an $n^+$ region in the substrate and a bitline on top, a pair of pull-down nMOS devices on the substrate connected to ground interconnects, and a pair of vertical high-resistive elements formed of a refractory metal-silicon-nitrogen and function as a load for connecting to Vdd. The invention further describes a method for fabricating such compact SRAM cell.

9 Claims, 4 Drawing Sheets

COMPACT SRAM CELL INCORPORATING REFRACTORY METAL-SILICON-NITROGEN RESISTIVE ELEMENTS AND METHOD FOR FABRICATING

CROSS-REFERENCE TO RELATED APPLICATION

This application is cross-referenced to Ser. No. 09/760,245, filed Jan. 12, 2001, which is directed to a semiconductor device incorporating elements of refractory metal-silicon-nitrogen and method for fabrication.

FIELD OF THE INVENTION

The present invention generally relates to a SRAM cell that has a compact size achieved by eliminating two pull-up transistors and a method for fabricating the cell and more particularly, relates to a compact SRAM cell that incorporates refractory metal-silicon-nitrogen resistive elements as its pull-up transistors and a method for fabricating the compact SRAM cell.

BACKGROUND OF THE INVENTION

High-density SRAM devices are desirable for high-speed cache applications. As the technology of process and device integration is advanced, more and more systems are being incorporated in a single chip. The system-on-chip (SOC) approach has become a trend for future electronic systems to meet both cost and performance requirements.

Traditionally, a SRAM cell is formed by six transistors, i.e. two pull-up pMOS devices, two pull-down nMOS devices and two others for NMOS transfer devices. Since data stored in the SRAM cells are latched by a pair of back-to-back invertors, no refresh operation and thus no associated circuitry are necessary. Furthermore, SRAM is inherently faster than DRAM (access time of 0.8 ns vs. 12 ns for DRAM) due to the fact that no write-back, precharge and refresh operations are required. In order for SRAM to be economically employed in electronic systems for high-performance, continuous efforts are being made to reduce its cost and chip size. In the past, thin film transistors were implemented to form high-density SRAM. The thin film transistors are used for the pull-up devices and are formed on top of the other devices such that the area may be saved. However, this approach not only leads to an increase in the process steps, but also results in relatively poor performance due to the limitation of TFT device performance.

More recently, four transistor SRAM transistors have been proposed and its development has gained a significant attention in the semiconductor industry. For instance, a four-T (transistor) single-port SRAM cell has been reported by NEC, titled "A 2.9 $\mu m^2$ Embedded SRAM Cell With Co-Salicide Direct-Strap Technology for 0.18 $\mu m$ High Performance CMOS Logic, IEDM 97, p 847,1997. This single-port SRAM cell shares the transfer gates with the pull-up devices and therefore eliminates two devices per cell. This approach has significantly reduced the cell size, and is a very attractive design for a high-density integration. Since the pull-up and the transfer devices in NEC's cell are pMOS devices, for the unselected wordlines, the wordline voltage and all the bitline voltages are held high. The nodes are isolated since the pMOS devices are turned off. However, the leakage charge from the internal high node is constantly replenished by the off-state current flowing through the pMOS pull-up devices. There are two drawbacks with this design, (1) the cell size is not minimal, since there is a minimal ground rule specified between p-well and n-well for placing mixed pMOS and nMOS devices in a cell, and (2) read/write disturb on the non-selected cell is an issue, since their bitlines are not constantly held high when the array is active.

It is therefore an object of the present invention to provide a SRAM cell that does not have the drawbacks or shortcomings of the conventional SRAM cells.

It is another object of the present invention to provide a SRAM cell that incorporates a vertical NMOS transfer device, a pair of pull-down nMOS devices and a pair of vertical high resistive elements.

It is a further object of the present invention to provide a compact SRAM cell that incorporates high-resistive refractory metal-silicon-nitrogen resistive elements in place of pull-up pMOS transistors.

It is another further object of the present invention to provide a compact SRAM cell wherein the cell size can be only 2.5× to 3× to that of DRAM cells.

It is still another object of the present invention to provide a compact SRAM cell that incorporates TaSiN resistive elements in place of pull-up pMOS transistors.

It is yet another object of the present invention to provide a method for forming a compact SRAM cell with refractory metal-silicon-nitrogen resistive elements in place of its pull-up transistors.

SUMMARY OF THE INVENTION

In accordance with the present invention, a compact SRAM cell incorporating refractory metal-silicon-nitrogen resistive elements as its pull-up transistors and a method for fabricating the compact SRAM cell are provided.

In a preferred embodiment, a compact SRAM cell that incorporates refractory metal-silicon-nitrogen resistive elements as its pull-up resistive lead elements are provided which include a semi-conducting substrate; a pair of NMOS transfer devices formed vertically on the substrate; a bitline contacting an $n^+$ region in the substrate in-between two adjacent transfer devices; a pair of pull-down nMOS devices where sources are connected to ground and drains are connected to a pair of vertical high resistive elements formed of a refractory metal-silicon-nitrogen and function as a load for connecting to Vdd.

In the compact SRAM cell incorporating refractory metal-silicon-nitrogen resistive elements as its pull-up elements, the refractory metal-silicon-nitrogen is formed of a refractory metal that is selected from the group consisting of Ta, Nb, V, W or Ti. The semi-conducting substrate may be a silicon-on-insulator substrate, for example, a silicon layer of about 300 nm thick formed on top of a buried oxide layer of about 100 nm thick. The cell may further include a shallow trench isolation formed in-between active areas on the semi-conducting substrate. The refractory metal-silicon-nitrogen may be TaSiN or may be TaSiN that consists of between about 10 at. % and about 55 at. % Ta, between about 10 at. % and about 45 at. % Si and between about 30 at. % and about 80 at. % N. The pair of vertical high resistive elements may be formed in the shape of studs. The pair of pull-down nMOS devices may further include gates formed of doped polysilicon.

The present invention is further directed to a method for forming a compact SRAM cell with refractory metal-silicon-nitrogen resistive elements as its pull-up elements which can be carried out by the operating steps of providing a semi-conducting substrate that has a silicon top layer; forming a first opening for vertical transfer gates; depositing a gate oxide layer and a gate conductor layer sequentially on top of the substrate; after patterning the pull-down nMOS gates, anisotropically etching the gate conductor layer to form gates for pull-down transistors and a pair of sidewall spacers in the first opening for vertical transfer gates; ion implanting into the silicon top layer forming $n^+$ source/drain regions for the pull-down transistors, and the vertical transfer gates; forming insulating sidewall spacers on the gates for pull-down transistors and an insulating layer on the sidewall in the opening of the vertical transfer gates; depositing an oxide insulating layer on top of the substrate and planarizing a top surface; etching a second plurality of openings in the oxide insulating layer for contact studs for the pull-down transistors and for the vertical transfer gate; filling the second plurality of openings with a conductive metal and planarizing top surfaces of the contact studs formed; etching a third plurality of openings in the oxide insulating layer defining regions for the resistive elements; sputter depositing refractory metal-silicon-nitrogen into the third plurality of openings forming the resistive elements; annealing the resistive elements at a temperature below a melting temperature of the refractory metal-silicon-nitrogen and planarizing top surfaces of the resistive elements; forming metal interconnects on top of the contact studs and the resistive elements; and forming a metal conductor on top of the contact stud to the junctions of vertical transfer gates serving as bitline.

The method for forming a compact SRAM cell with refractory metal-silicon-nitrogen resistive elements as its pull-up elements may further include the step of providing the semi-conducting substrate in a silicon-on-insulator substrate, or the step of providing the semi-conducting substrate in a silicon-on-insulator substrate consisting of about 300 nm thick silicon layer on about 100 nm thick oxide layer. The method may further include the step of forming the first opening to form vertical transfer gates to a depth of about 150 nm, or the step of depositing the gate conductor layer in doped polysilicon. The method may further include the step of forming the insulating sidewall spacers on the gates from an oxide layer, and forming the insulating layer on the sidewall spacers in the opening for vertical transfer gate from silicon nitride. The method may further include the step of depositing the oxide insulating layer to a thickness of at least 3000 Å, or the step of depositing the oxide insulating layer of a material selected from the group consisting of PSG, BPSG, CVD TEOS and CVD oxide.

The method may further include the step of planarizing the oxide insulating layer by a chemical mechanical polishing technique, or the step of filling the second plurality of openings by a CVD tungsten technique. The method may further include the step of sputter depositing TaSiN into the third plurality of openings forming the resistive elements, or the step of sputter depositing TaSiN consisting of between about 10 at. % and about 55 at. % Ta, between about 10 at. % and about 45 at. % Si and between about 30 at. % and about 80 at. % N. The method may further include the step of depositing the refractory metal-silicon-nitrogen wherein the refractory metal is selected from the group consisting of Ta, Nb, V, W and Ti. The method may further include the step of forming metal interconnects for ground on top of the contact studs, and forming metal interconnects for Vdd on top of the resistive elements.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a compact SRAM cell that incorporates refractory metal-silicon-nitrogen resistive elements in place of pull-up transistors and a method for forming the cell.

The compact SRAM cell may have a structure that includes semi-conducting substrate; a pair of NMOS transfer devices formed vertically on the sidewalls of an etched structure on the substrate by a metal conductor providing electrical communication between an $n^+$ region in the substrate and a bitline on top; a pair of pull-down nMOS devices on the substrate connected to ground interconnects; and a pair of vertical high resistive elements formed of a refractory metal-silicon-nitrogen and function as a load for connecting to Vdd. The refractory metal in the refractory metal-silicon-nitrogen composition may be selected from the group consisting of Ta, Nb, V, W and Ti.

The invention further discloses a method for forming a compact SRAM cell with refractory metal-silicon-nitrogen resistive elements in place of pull-up transistors which includes various processing steps for forming a pair of vertical transfer gates, a pair of horizontal (or planar) pull-down transistors and a pair of resistive elements on a silicon on insulator (or SOI) substrate. The method includes various steps of deposition, etching, ion implantation, sidewall spacer formation, sputtering deposition and chemical mechanical polishing.

In the present invention novel method, a small-size, high-resistive elements is used as the load to replace the pull-up pMOS devices of a SRAM cell. The high-resistive element may also be known as "high-R" resistor which is formed of a refractory metal-silicon-nitrogen such as TaSiN. The resistivity of such material can range from 0.2 to greater than 10,000 mΩHM-cm. The refractory metal in the material may be selected from the group consisting of Ta, Nb, V, W and Ti. For instance, the refractory metal-silicon-nitrogen may be TaSiN which contains Ta between about 10 at. % and about 55 at. %, Si between about 10 at. % and about 45 at. % and N between about 30 at. % and about 80 at. %.

A major object of the invention is to propose a small-size SRAM cell using vertical high-R elements as the load. Another object of this invention is to integrate a pair of vertical transfer devices to reduce the SRAM size. Another object is to provide a detailed step-by-step instruction on how to form such a small SRAM cell including a gate diffusion cross-over structure, and an etch-through contact technique to realize a compact gate to junction contact. The final SRAM cell size can be only 2.5x to 3x to that of DRAM cells.

Figure 11A:
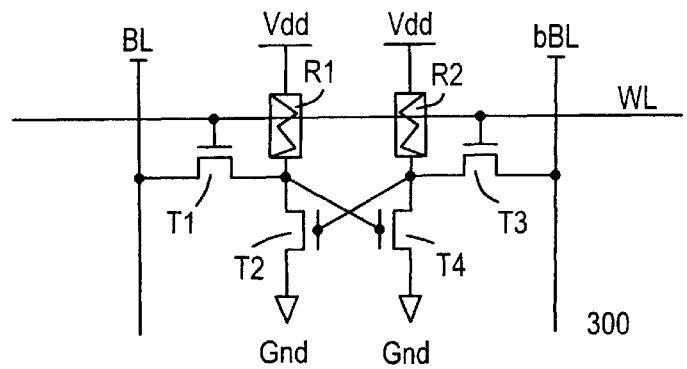
FIG. 11A is a schematic of the present invention SRAM circuit.

The SPAN cell schematic having two high-R elements for loading is shown in FIG. 11A. In FIG. 11A, R1 and R2 are two identical resistive elements formed by using a method mentioned previously. The high-R elements (i.e. R1 and R2) are used to replace the pull-up pMOS devices, therefore one end is tied to Vdd power supply, the other end is tied to the joined junctions of transfer gate, the first pull-down device and the gate of the second pull-down device. The T1 and T3 transfer devices are vertical devices formed on the sidewalls so as to save cell real estate. The pull-down devices T2 and T4 are formed on the surface using a conventional method and R1 and R2 are the stud resistors, which also significantly reduce the chip size.

Figure 1:
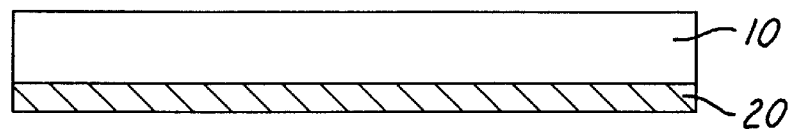
FIG. 1 is an enlarged, cross-sectional view of the present invention silicon-on-insulator substrate.
Figure 2:
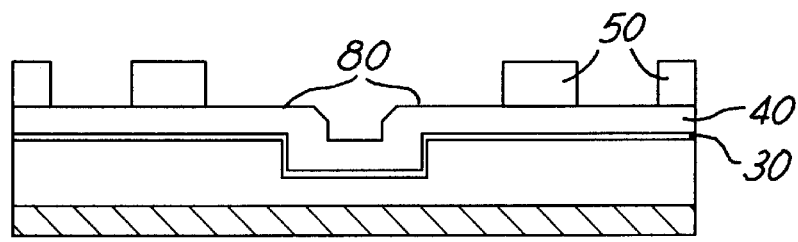
FIG. 2 is an enlarged, cross-sectional view of the present invention SOI substrate of FIG. 1 with an opening formed for vertical transfer gate, a gate oxide layer and a gate conductor layer deposited, and a mask formed and patterned on top.
Figure 3:
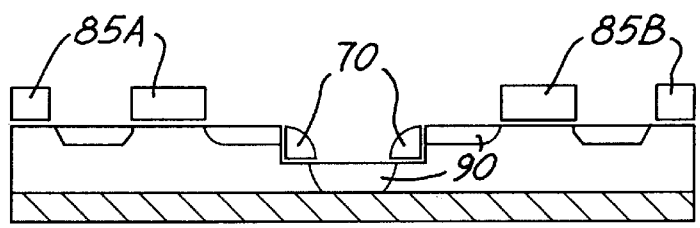
FIG. 3 is an enlarged, cross-sectional view of the present invention SOI substrate of FIG. 2 with both horizontal and vertical gates formed and source/drain regions implanted.

An example of fabrication steps are shown in FIG. 1 to FIG. 10B using a SOT substrate. The same method can also be applied to a bulk substrate with proper well isolations. In FIG. 1, an SOT (silicon-on-insulator) wafer is used. A SOI substrate silicon 10 of about 300 nm thick is formed on top of a buried oxide layer 20 of about 100 nm thick. A shallow trench isolation is formed in the horizontal direction (not shown) in the cross-section to isolate active areas in-between rows. In FIG. 2, a mask is used to define the vertical transfer gate region 60 and to etch active and isolation area to a proper depth of about 150 nm. Gate oxide layer 30 is then formed, for example, thermal oxidation 30. The gate conductor material 40 can be deposited of doped polysilicon. Another mask 50 is used to define gate conductors of pull-down devices. After a directional etch, as shown in FIG. 3, pull-down device gate regions 85A and 85B and transfer devices 70 on the sidewalls of the first etch regions are formed.

Figure 4:
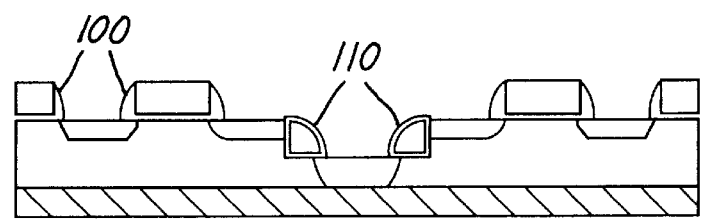
FIG. 4 is an enlarged, cross-sectional view of the present invention structure of FIG. 3 with dielectric spacers formed on the horizontal gates and on the sidewall of the vertical transfer gate.

In FIG. 4, a conventional oxide and nitride sidewall spacers 100 are formed. The spacers are formed on the sidewalls of vertical transfer gates 110 and sidewalls of vertical devices 110. This process consists of oxidizing the exposed polysilicon surfaces to about 10 nm and then deposit a thin layer of CVD nitride to about 15 nm, followed by an anisotropic etch-back step. A $n^+$ source/drain implant action is performed to form junctions for devices. Source/drain junction 143A and 143B are for the pull down devices, while 143C is for the vertical devices.

Figure 5:
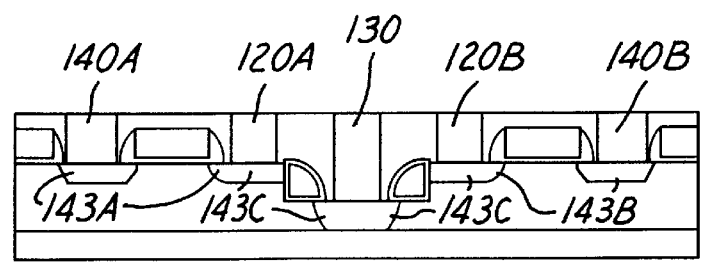
FIG. 5 is an enlarged, cross-sectional view of the present invention structure of FIG. 4 with an insulating layer deposited on top, openings formed and filled with a conductive metal and planarized.

In FIG. 5, an insulating material is deposited and planarized by using a chemical mechanical polishing technique. The insulator, for example, oxide, doped glass, TEOS or polymers can be deposited using CVD, sputtering or a coating method. Contact studs 140A and 140B are formed to make contact to the planar devices. The gate to junction contact is through contacts 120A and 120B. Using a local interconnect technique to save area significantly and will be further discussed in a later session. Contact to the common source of the vertical device 130 is also formed at the same time. Noted that this contact is deeper than the contacts to the planar devices. CVD tungsten, or other similar material, can be deposited and polished for planarization.

Figure 6:
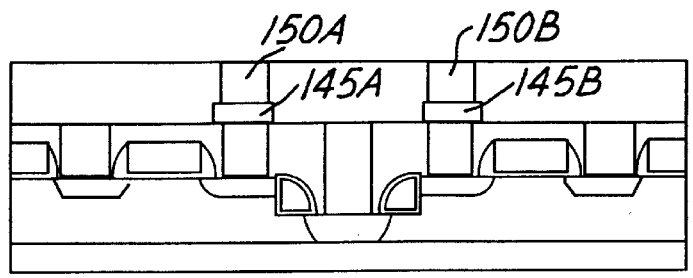
FIG. 6 is an enlarged, cross-sectional view of the present invention structure of FIG. 5 with openings for resistive elements formed and filled with a refractory metal-silicon-nitrogen and planarized.

In FIG. 6, a local metal wiring level, or the first level wiring 145A and 145B, is patterned to form connections between gate and junctions. A second insulating material is deposited followed by a via etch to define the high-R element regions. The shapes of 150A and 150B are similar to that of the regular contacts, just the material used is different. For example, TaSiN material is deposited using a sputtering method in an ultra-high vacuum system. A Ta—Si alloy target in presence of $N_2$ gas or co-sputtering a Ta target and a Si target in presence of $N_2$ gas. After material is deposited and annealed, a planarization step is carried out. The thickness of the second insulating material is controlled so that a proper resistivity of the high-R elements can be detained.

Figure 7:
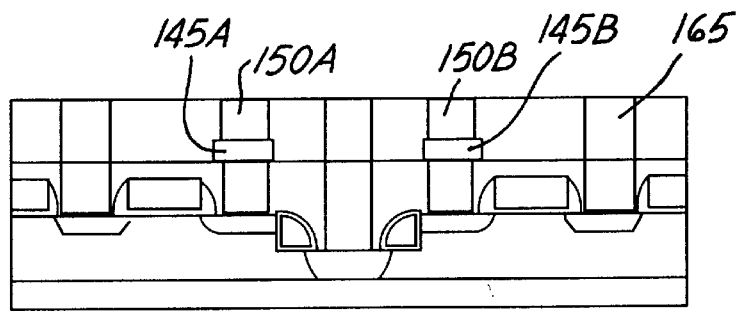
FIG. 7 is an enlarged, cross-sectional view of the present invention structure of FIG. 6 with metal interconnects formed for power line connections.

FIG. 7 shows that a second via level is patterned and vias 165 are formed using a similar method and material as that of the first via.

Figure 8:
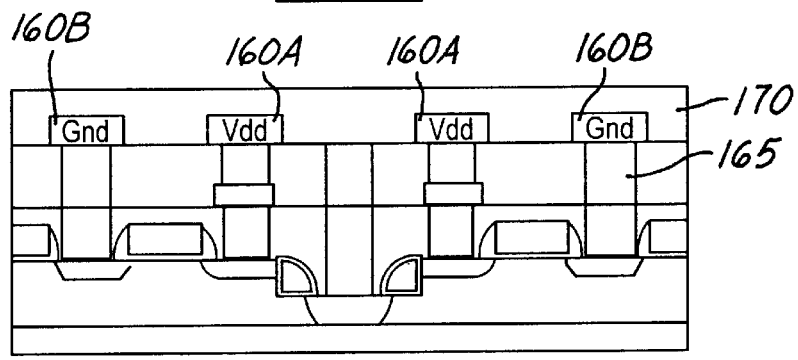
FIG. 8 is an enlarged, cross-sectional view of the present invention structure of FIG. 7 with an insulating layer deposited and planarized on top.
Figure 9:
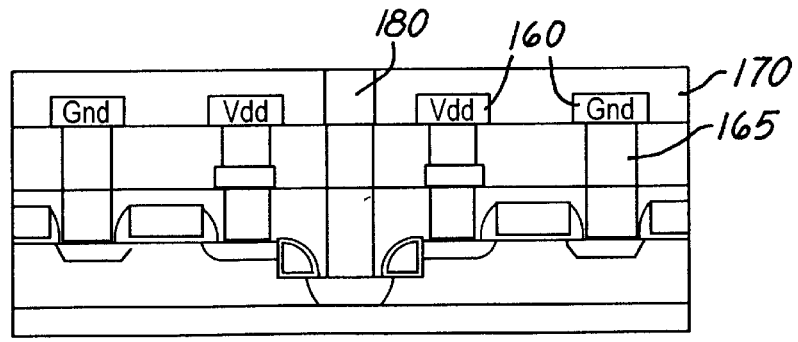
FIG. 9 is an enlarged, cross-sectional view of the present invention structure of FIG. 8 with a contact hole opened and filled with a conductive metal forming a second level contact.

FIG. 8 shows a second metal is patterned to form power supply wirings for Vdd and ground 160A, 160B, respectively. After another insulating material 170 is deposited and planarized, as shown in FIG. 9, a third level via 180 is formed. The material of the studs can be tungsten, aluminum, copper or the like.

Figure 10A:
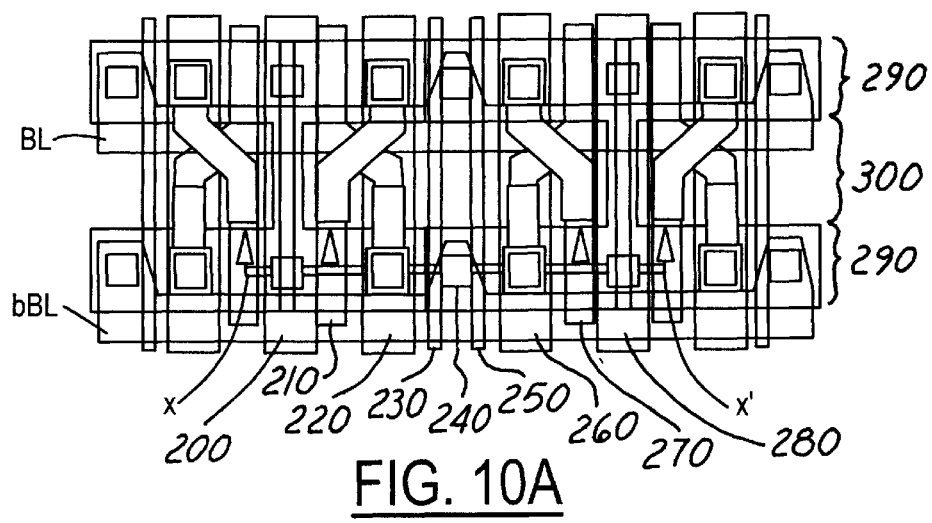
FIG. 10A is a plane view of the present invention SRAM layout comprising a row of SRAM cells.
Figure 10B:
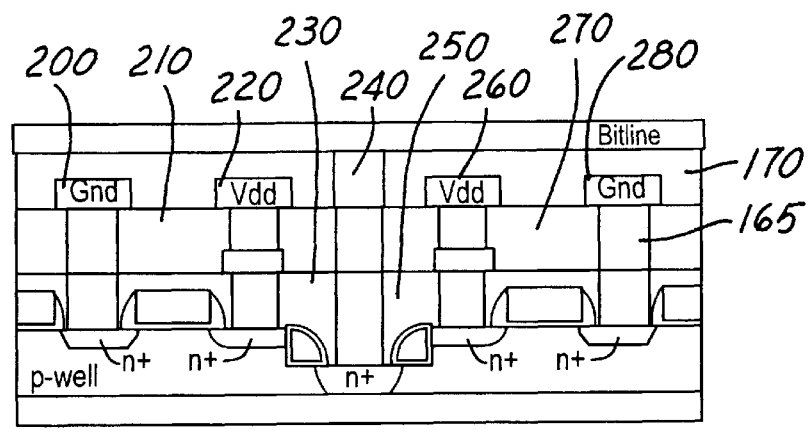
FIG. 10B is an enlarged, cross-sectional view of FIG. 10A along the X—X line of the present invention SRAM cell.

In FIG. 10B, the third metal wire such as aluminum or copper is formed using a conventional method. The metal is used for the bitlines which traverse in the horizontal direction. A corresponding top view of a single row of SPAN cells layout is also illustrated. The cross-sectional view along X–X' covers elements: 200 the first ground line for the source of the fist pull-down device, 210 the first planar gate of the first pull-down device, 220 the Vdd contact for the supply to the first high-R element, 230 the first vertical transfer gate, 240 the bitline contact, 250 the second vertical transfer gate, 260 the second Vdd for the supply of the second high-R element, 270 the gate of the second planar pull-down device and 280 the ground contact for the source of the second pull-down device. Both BL and bBL shown in FIG. 10A are made of second level metal. Also shown in FIG. 10A is region 290 which is the active area where devices are built, region 300 is the shallow trench region to isolate devices.

Figure 11B:
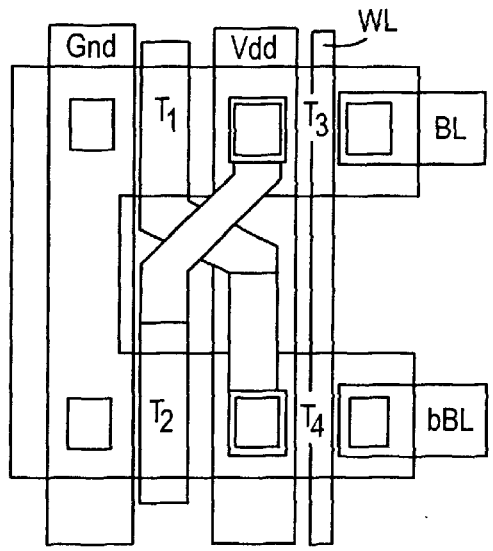
FIG. 11B is a plane view of a layout of the present invention SRAM cell.

In FIGS. 11A and 11B, the schematic and layout of the new compacted SPAN cell are shown. In the layout, T2 and T4 are the two planar pull-down devices having their gates contacted to the respective junctions using the first wiring local metal interconnects and therefore no extra area is needed. The gate of top pull-down device T1 has an active region connected to the junction of the bottom pull-down device also by a local interconnect technique. This arrangement saves the layout area, and thus the cell size can be very small.

Figure 12:
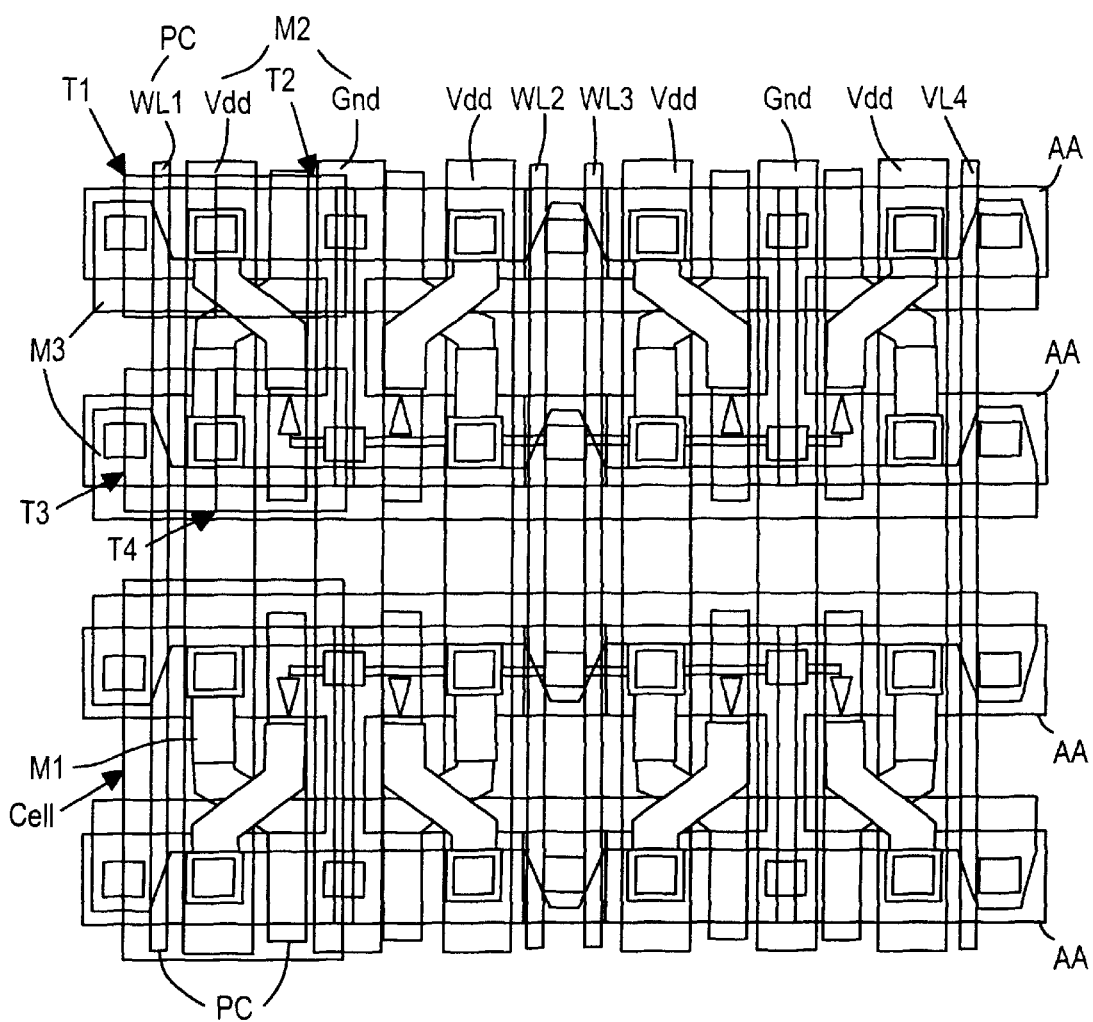
FIG. 12 is a plane view of a full layout of the present invention high-density SRAM comprising two rows of SRAM cells.

In FIG. 12, a layout of two rows of high-density SPAN cells are shown. The polysilicon gate region is marked as "PC" and the active area is marked as "AA". The local interconnect is formed by using first metal M1. The vertical metal wire group is formed using the second metal level and is marked as M2, the horizontal metal wire group is formed using the third metal level marked as M3. Four dark-lined boxes are highlighted. These are T1, the first transfer device, T2, the first pull-down device, T3, the second transfer device and T4, the second pull-down device. The SPAN cell boundary is marked by a dashed-line box.

An ultra-small SRAM cell design is made possible by the present invention novel method. The cell structure comprises a pair of vertical transfer gates, a pair of planar pull-down devices, and a pair of vertical via-type high-R elements. The "X" shape local interconnect to link gate to junction can significantly reduce the cell size. The high-R element is formed by sputtering of TaSiN into a small via. The cell structure as well as the process steps are unique in the art.

The present invention novel compact SRAM cell incorporating refractory metal-silicon-nitrogen resistive elements as its pull-up transistors and a method for fabricating the compact SRAM cell have therefore been amply described in the above description and in the appended drawings of FIGS. 1–12.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A compact SPAN cell comprising:

a semi-conducting substrate;

a pair of vertical NMOS transfer devices;

a pair of planar pull-down nMOS devices; and a pair of vertical high resistive load elements formed of a refractory metal-silicon-nitrogen material.

2. A compact SPAN cell incorporating refractory metal-silicon-nitrogen resistive elements as its pull-up load elements according to claim 1, wherein said refractory metal-silicon-nitrogen being formed of a refractory metal selected from the group consisting of Ta, Nb, V, W and Ti.

3. A compact SPAN cell according to claim 1, wherein said semi-conducting substrate is a silicon on insulator substrate.

4. A compact SPAN cell according to claim 1, wherein said semi-conducting substrate is a silicon layer of about 300 nm thick formed on top of a buried oxide layer of about 100 nm thick.

5. A compact SPAN cell according to claim 1, wherein said cell further comprises a shallow trench isolation formed in-between active areas on said semi-conducting substrate.

6. A compact SPAN cell according to claim 1, wherein said refractory metal-silicon-nitrogen is TaSiN.

7. A compact SPAN cell according to claim 1, wherein said refractory metal-silicon-nitrogen is TaSiN consisting of between about 10 at. % and about 55 at. % Ta, between about 10 at. % and about 45 at. % Si and between about 30 at. % and about 80 at. % N.

8. A compact SPAN cell according to claim 1, wherein said pair of vertical high resistive elements are formed in the shape of studs.

9. A compact SPAN cell according to claim 1, wherein said pair of pull-down nMOS devices further comprise gates formed of doped polysilicon.

* * * * *